(12) United States Patent
Ma

(10) Patent No.: US 6,236,116 B1
(45) Date of Patent: May 22, 2001

(54) SEMICONDUCTOR DEVICE HAVING A BUILT-IN HEAT SINK AND PROCESS OF MANUFACTURING SAME

(75) Inventor: Manny Kin F. Ma, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/146,417

(22) Filed: Sep. 3, 1998

(51) Int. Cl.[7] .................................................. H01L 23/28
(52) U.S. Cl. ............................................. 257/796; 257/712
(58) Field of Search .................................... 257/712, 796, 257/787

(56) References Cited

U.S. PATENT DOCUMENTS

| | | | |
|---|---|---|---|
| 5,216,283 | 6/1993 | Lin | 257/787 |
| 5,305,179 * | 4/1994 | Sono et al. | 257/796 |
| 5,311,060 | 5/1994 | Rostoker et al. | 257/796 |
| 5,444,304 | 8/1995 | Hara et al. | 257/796 |
| 5,614,735 * | 3/1997 | Kitamura et al. | 257/796 |

* cited by examiner

Primary Examiner—Roy Potter
(74) Attorney, Agent, or Firm—Hugh R. Kress; Winstead, Sechrest & Minick, PC

(57) ABSTRACT

The present invention provides a semiconductor device assembly comprising a semiconductor chip, a heat sink having internal and external portions, and a housing that encapsulates the semiconductor chip and the internal portion. The internal portion thermally couples to one surface of the semiconductor chip. The present invention also provides a process of fabricating a semiconductor device assembly. The process includes: providing a semiconductor chip; providing a heat sink having internal and external portions; mechanically attaching a face of the chip to the internal portion; and applying an encapsulating material around the semiconductor chip and the internal portions.

21 Claims, 10 Drawing Sheets

SEMICONDUCTOR DEVICE HAVING A BUILT-IN HEAT SINK AND PROCESS OF MANUFACTURING SAME

BACKGROUND OF THE INVENTION

1. Field of the Invention

This invention relates in general to semiconductor devices and, more particularly, to a semiconductor device assembly having a integral heat sink.

2. Description of the Related Art

As used herein, the term "semiconductor chip" refers to a silicon chip or die containing circuitry to form an active device. The term "semiconductor device assembly" refers to the semiconductor chip and associated components. The "associated components" include the leads for connecting the chip to a circuit board, a heat sink for dissipating heat, and an encapsulating package. Efforts to provide better semiconductor device assemblies have targeted the associated components, e.g., the packaging and heat sinks.

To reduce costs and to promote miniaturization, some semiconductor manufacturers are employing a vertical surface mount package (VSMP) having multiple pins. The VSMP package mounts vertically on a circuit board thereby allowing for a greater density of device assemblies without departing from the use of plastic molding materials.

FIG. 1 illustrates a VSMP assembly 1 having a plastic housing 4. The plastic housing 4 is a rectangular parallelepiped having length "a," width "b," and height "c." The width "b" is ordinarily relatively small, e.g., 1.2 mm, compared to the length "a" and the height c. Supports legs 3 provide for vertically mounting the VSMP assembly 1 on a circuit board (not shown).

FIG. 2A is a cross-sectional view of VSMP assembly 1 along line B—B of FIG. 1. Metallic wires 7 connect a semiconductor chip 6 to lead terminals 2 The lead terminals 2 carry input and output signals to and from the semiconductor chip 6.

VSMP assemblies currently house low power semiconductor chips. It would be advantageous to use the VSMP assemblies with semiconductor chips having high power consumption. High power chips include, but are not limited to, static or dynamic random-access memories ("SRAM" or "DRAM", respectively), transistor-transistor logic ("TTL") and Sync-Link DRAM ("SLDRAM"). Power consumption can reach 2 watts in some contemporary high power chips, e.g., current SLDRAM's.

High power semiconductor devices can generate enough the heat to damage a semiconductor chip. Furthermore, the plastic housing impedes heat dissipation due to plastic's insulating properties. For high power chips, the semiconductor device assembly needs elements to dissipate heat that is not efficiently dissipated through the plastic housing.

The prior art has employed heat sinks to dissipate heat generated by high power semiconductor chips. Typically, high power chips are packaged in leadless chip carriers or in quad-flat packages. These types of packages have generally used either internal heat sinks or external heat sinks.

In the internal form, the heat sink is inside the plastic package and in close contact with a large portion of the surface of the chip. The close contact conducts heat from the chip to the heat sink. Nevertheless, since the plastic package is not a good thermal conductor, an internal heat sink does not efficiently transfer heat from the heat sink to the exterior of the package. If an internal heat sink is employed, a high-power semiconductor chip can still overheat.

FIG. 2B illustrates a device assembly 5 employing an external heat sink 8. The heat sink 5 makes mechanical and thermal contact with a support member 9 attached to a back face of the semiconductor chip 6. A portion of the external heat sink 8 makes direct contact with the support member 9 through a hole 11 in a front or large-area surface of the device assembly 5.

Still referring to FIG. 2B, external heats have several drawbacks. First, the hole 11 through a large area surface of the housing can weaken the physical strength of the device assembly 5. Second, attaching the heat 8 sink through the hole 11 does not provide a strong bond. The heat sink 8 may move reducing the quality of the thermal contact between the heat sink 8 and the underlying semiconductor chip 6. Attaching the heat sink 8 flat against the plastic housing 4 can reduce risk of relative motion between the heat sink 8 and the housing 4, but the thermal efficiency for heat dissipation will also be reduced. The external heat sink may not provide an adequate solution to the need for heat dissipation in high power semiconductor chips.

The present invention is directed to overcoming, or at least reducing the effects of, one or more of the problems set forth above.

SUMMARY OF THE INVENTION

In a first aspect, the present invention provides a semiconductor device assembly comprising a semiconductor chip, a heat sink having internal and external portions, and a housing that encapsulates the semiconductor chip and the internal portion. The internal portion thermally couples to one surface of the semiconductor chip. In a second aspect, the present invention provides a process of fabricating a semiconductor device assembly. The process includes: providing a semiconductor chip; providing a heat sink having internal and external portions; mechanically attaching a surface of the chip to the internal portion; and applying an encapsulating material around the semiconductor chip and the internal portions.

BRIEF DESCRIPTION OF THE DRAWINGS

Other aspects and advantages of the invention will become apparent upon reading the following detailed description and upon reference to the drawings, in which.

Figure 1:
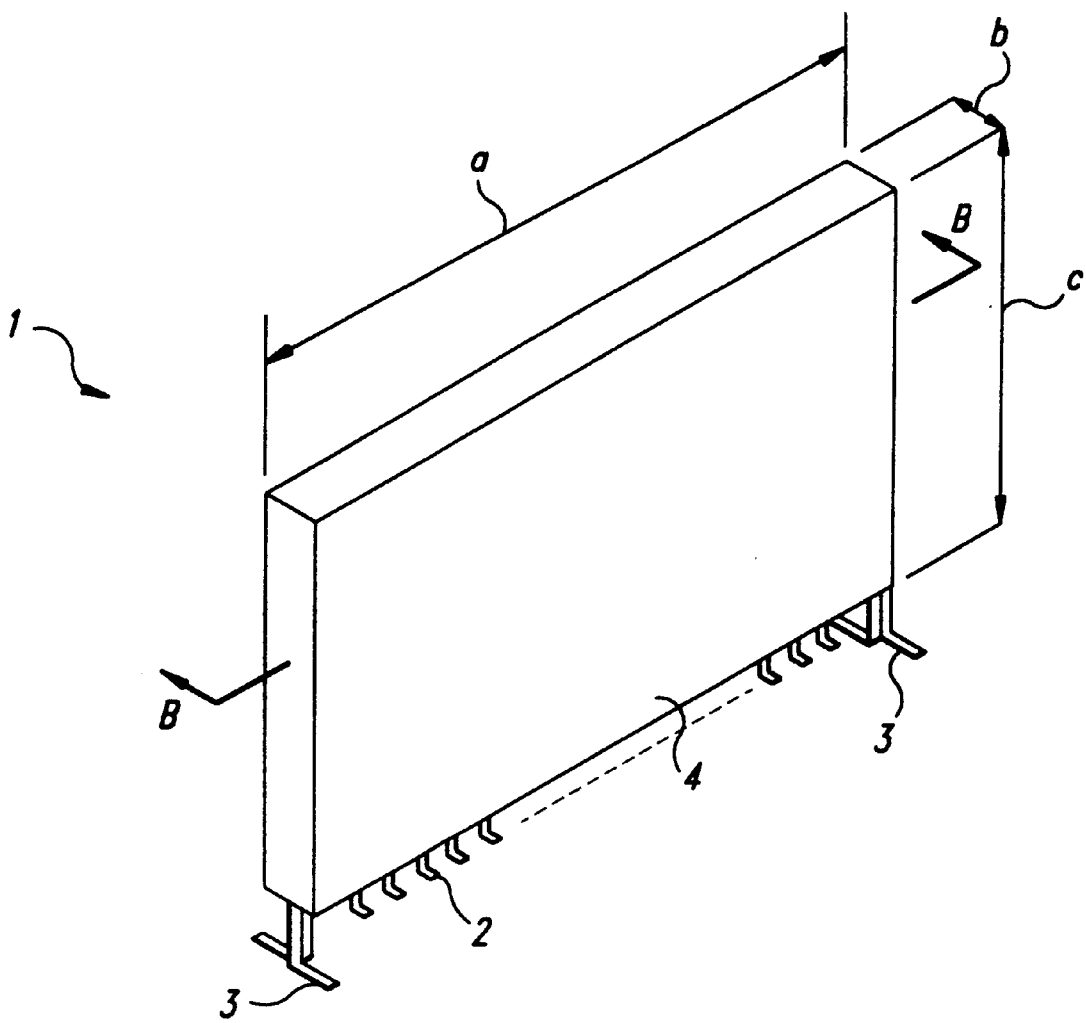
FIG. 1 is a 3-dimensional view of a vertical surface mount package (VSMP) assembly of the prior art.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Specific embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 2A:
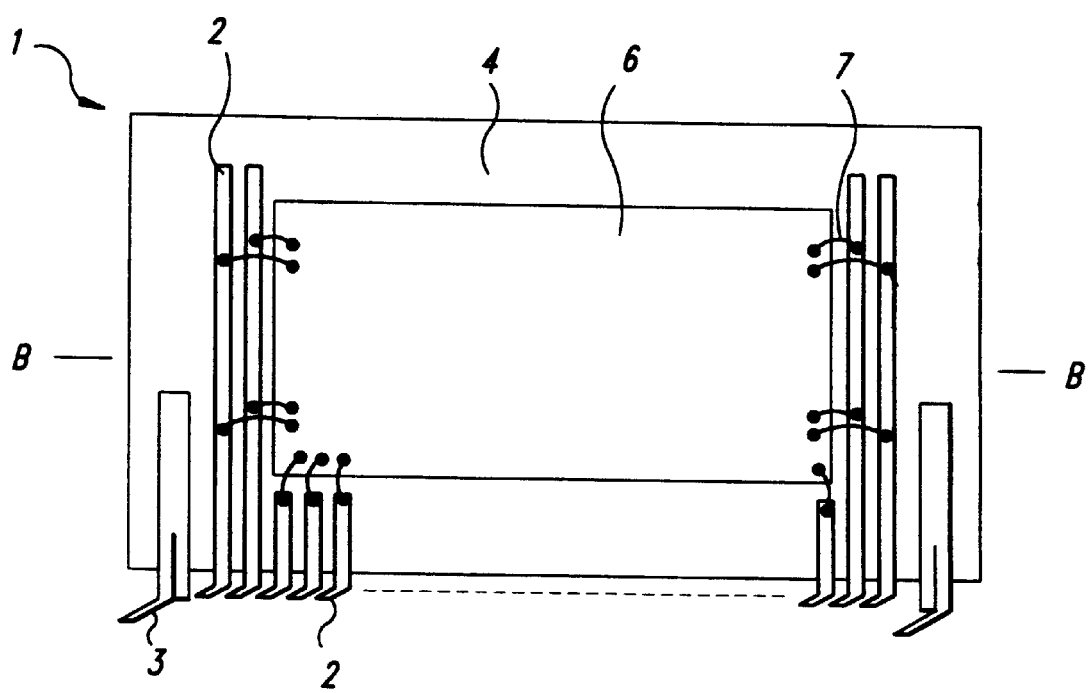
FIG. 2A is a cross-sectional view along axis B—B of the VSMP assembly of FIG. 1.
Figure 2B:
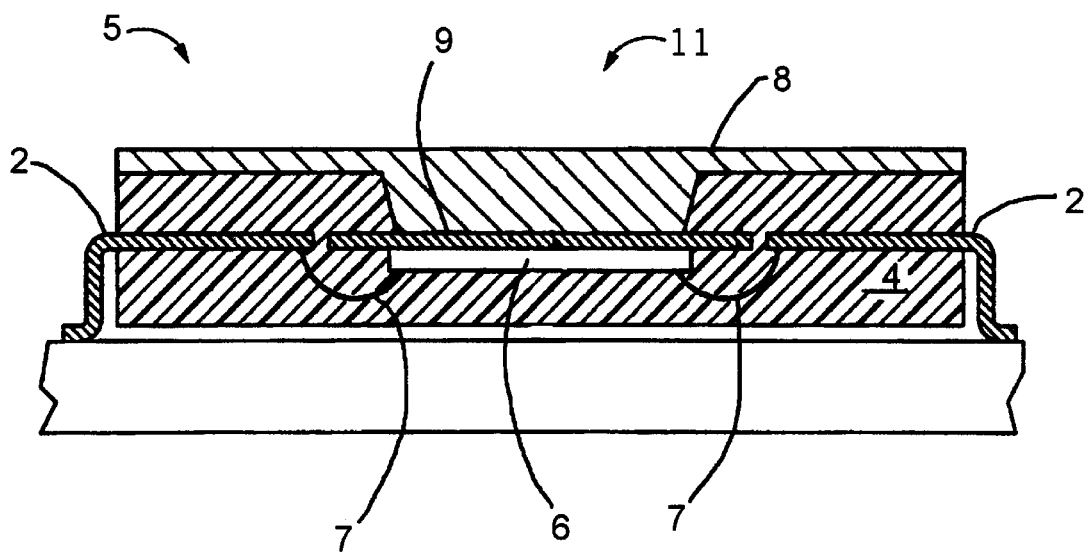
FIG. 2B is a cross-sectional view of a prior art semiconductor device assembly employing an external heat sink.
Figure 3:
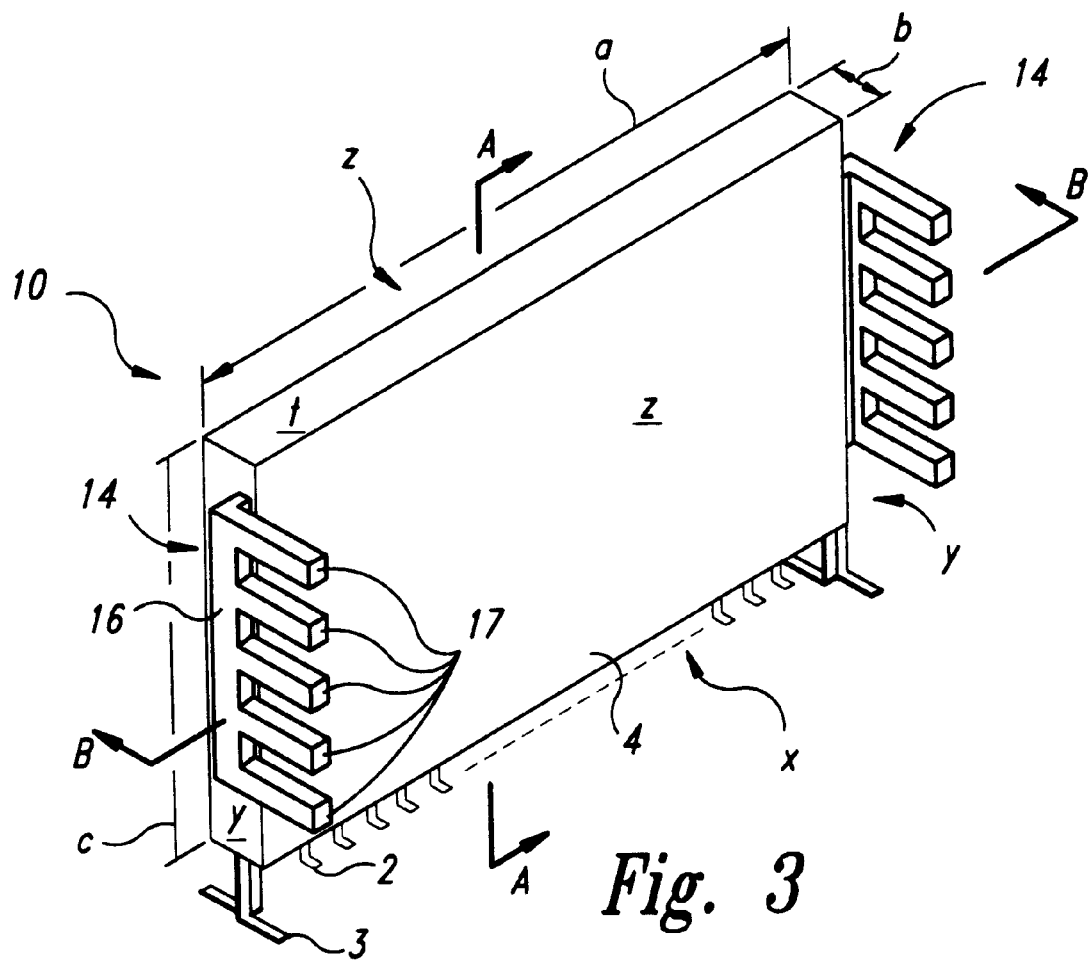
FIG. 3 is a 3-dimensional view of a VSMP assembly having a built-in heat sink in accordance with one embodiment of the present invention.
Figure 4A:
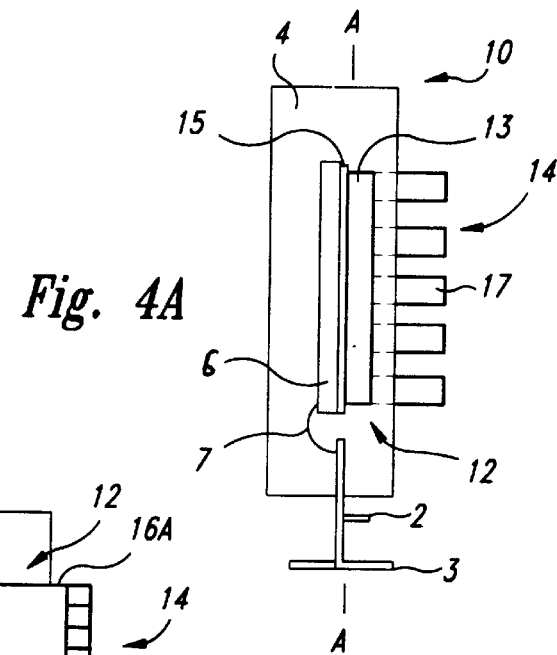
FIGS. 4A and 4B are cross-sectional views of the VSMP assembly of FIG. 3, taken along the axes A—A and B—B therein.
Figure 4B:
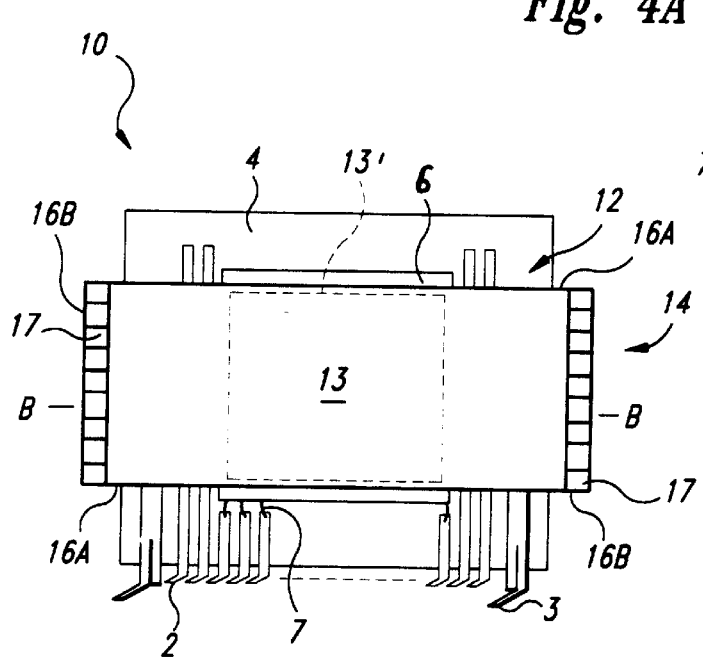

FIGS. 3, 4A, and 4B show an embodiment for a vertical surface mount package (VSMP) assembly 10 having a built-in heat sink. For the sake of clarity, the reference numbers for elements of the prior art VSMP assembly 1 of FIGS. 1 and 2 will be used to reference the same elements in the specific embodiments. The semiconductor chip 6 may, in some embodiments, have a high power consumption, similar to the power consumption of a SLDRAM device although this is not necessary to the practice of the invention. Metallic wires 7 connect the semiconductor chip 6 to the lead terminals 2. The lead terminals 2 provide a path for input and output signals to and from the semiconductor chip 6 during operation.

Referring to FIGS. 3, 4A, and 4B, the VSMP assembly 10 also includes a heat sink 12. The heat sink 12 is a molded structure and is made of a thermally conductive material, e.g., aluminum filled with polymer, copper or gold filled with fused silica or boron nitrate. The heat sink 12 has an internal and any external portions 13, 14 with respect to the housing 4. A central area 13' of the internal portion 13 attaches to the backside of the semiconductor chip 6 through a lead on chip (LOC) tape 15. The LOC tape is thermally conductive, but not electrically conductive. The plastic housing 4 encapsulates the chip 6 and internal portion 13. The external portions 14 of the heat sink 12, and the lead terminals 2 protrude from the housing 4. The heat sink 12 is permanently mounted in the VSMP assembly.

Referring to FIG. 3, the VSMP assembly 10 is a rectangular parallelepiped from which the external portions 14 of the heat sink 12 protrude. The rectangular parallelepiped has front/back face surfaces "z" defined by the length "a" and height "c," and top/bottom and left/right end surfaces "t," "x," and "y" defined by the length "a" and width "b" and the height "c" and width "b," respectively. The heat sink 12 protrudes through the narrow end surfaces "y" and/or "f" so that plastic housing 4 can secure the heat sink 12 more firmly than if it protruded through either the front or back faces z.

Referring to FIGS. 3, 4A, and 4B, the exterior portions 14 of the heat sink 12 include a continuation 16A of the internal portion 13 and a radiating fin structure 16B comprising a plurality of posts 17. The continuation 16A leaves the housing 4 through right/left end surfaces "y" and provides a lateral clearance between the fin structure 16B and the housing 4. The fin structure 16B extends perpendicular to the front face surface "z." The form of the fin structure 16B depends on implementation specific constraints.

Referring to FIG. 3, the posts 17 of the fin structure 16B can take a variety of lengths and shapes, e.g., rectangular, circular, triangular, and configurations, e.g., hollow or solid. The continuation 16A may also be wider than the height "c" of the housing 4 to provide a greater area for the fin structure 16B.

The plastic housing 4 can have a variety of shapes, e.g., round, square, elliptical, etc. In such embodiments, the heat sink 12, terminals 2, and supports 3 protrude from the smaller area surfaces of the plastic housing 4.

Referring to FIG. 4A, the semiconductor chip 6 generates heat during normal operation. The heat will flow from the chip 6 to the conductive LOC tape 15 and into the heat sink 12, because the LOC tape 15 provides for good heat transfer. Nevertheless, the LOC tape 15 electrically insulates the heat sink 12 from the chip 6. The LOC tape 15 may be as thin as about ten millionths of an inch. The posts 17 aid in dissipating the heat from the external portion 14 of the heat sink 12. Air convection (not shown) may also assist in cooling the external portions 14 of the heat sink.

Referring to FIGS. 3, 4A, and 4B, the shape and dimensions of the external portion 14 of the heat sink 12 depend on the specific details of the implementation, e.g., the power and size of the semiconductor chip 6 and the packing on a circuit board. Preferably, the shape and size of the heat sink 12 keeps the semiconductor chip 6 at a temperature of between about 70 to 120 degrees centigrade during normal operation.

Figure 5A:
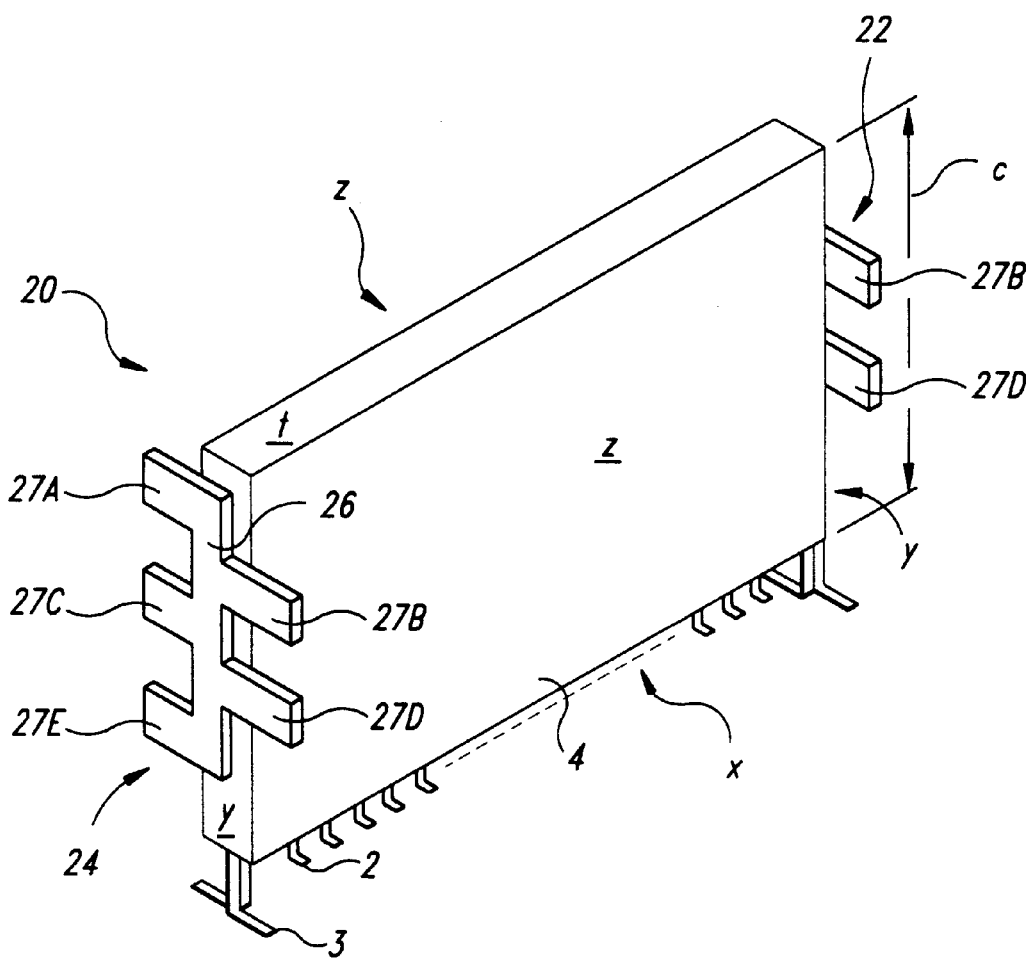
FIGS. 5A and 5B are perspective views of the VSMP assembly of FIG. 3 including an alternate embodiments of the exterior fin structures in FIG. 3.

FIG. 5A illustrates an embodiment of a VSMP assembly 20. First and second fin structures 22, 24 of a heat sink 26 extend from the left and right end surfaces "y" and are directed approximately perpendicular to the front and back face surfaces "z" of the plastic housing 4. The fin structures 22, 24 include a plurality of posts 27A–27E that interlace to allow for dense packing of VSMP assemblies 20. Two VSMP assemblies 20 can be adjacent on a circuit board, because the fins 27B and 27D of a first one of the VSMP assemblies 20 would fit between the fins 27A, 27C, and 27E of a second one of the VSMP assemblies 20.

Figure 5B:
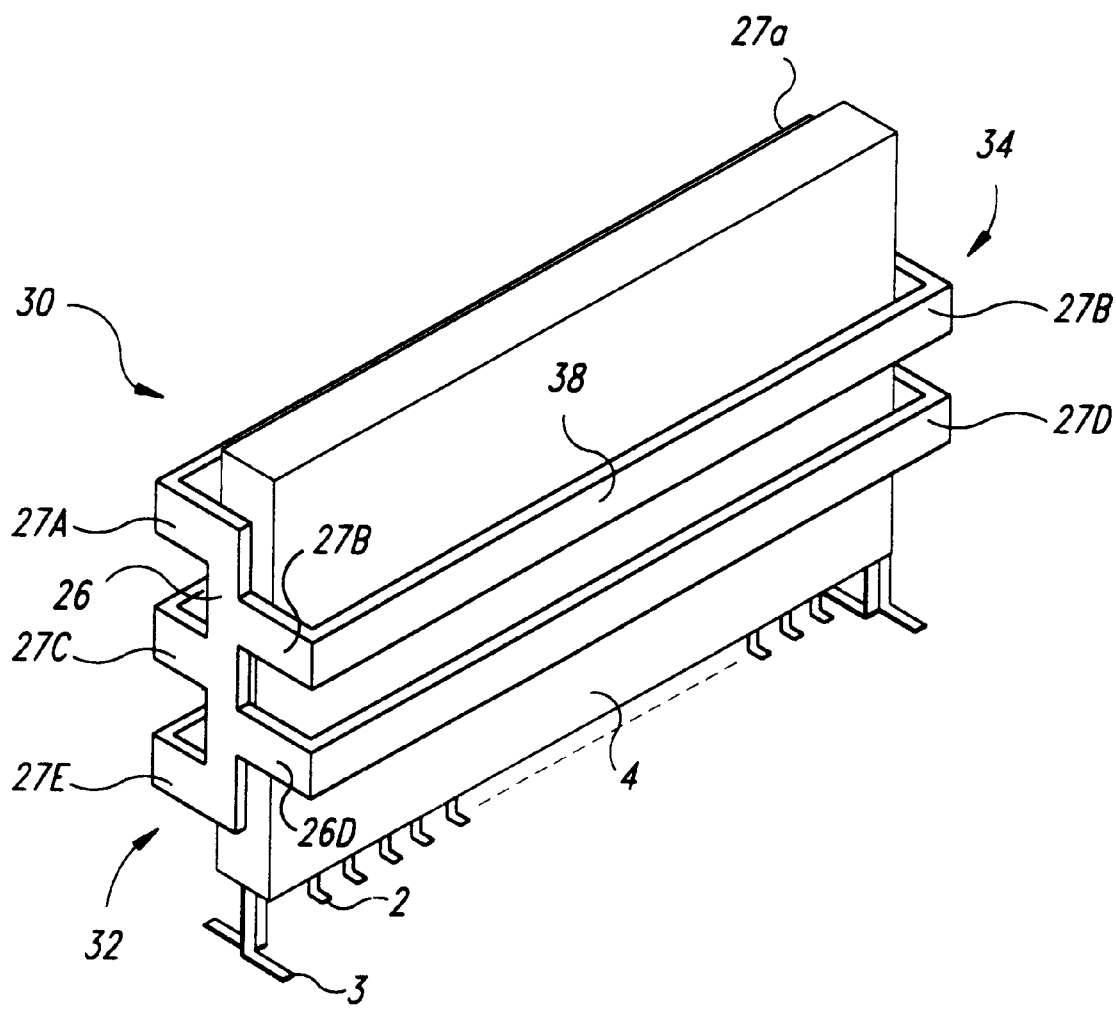

FIG. 5B illustrates a VSMP assembly 30 having an alternate fin structures 32, 34 that may provide higher heat dissipation. The interlinking arms 38 provide an additional larger external surface for heat dissipation. Additionally, the arms 38 provide a cage structure to protect the housing 4 from other adjacent devices (not shown). The housing 4 may be completely caged by the arms 38. The fingers 27A, 27C, and 27E are complementarily positioned with respect to the fingers 27B and 27D. Consequently, an adjacent VSMP assembly 30, can be packed on a circuit board (not shown) so that the fins 27A–27E interlace. In some embodiments the arms 38 may be attached, e.g., soldered or otherwise mechanically fixed, to the circuit board or to other VSMP assemblies (both not shown).

Figure 7:
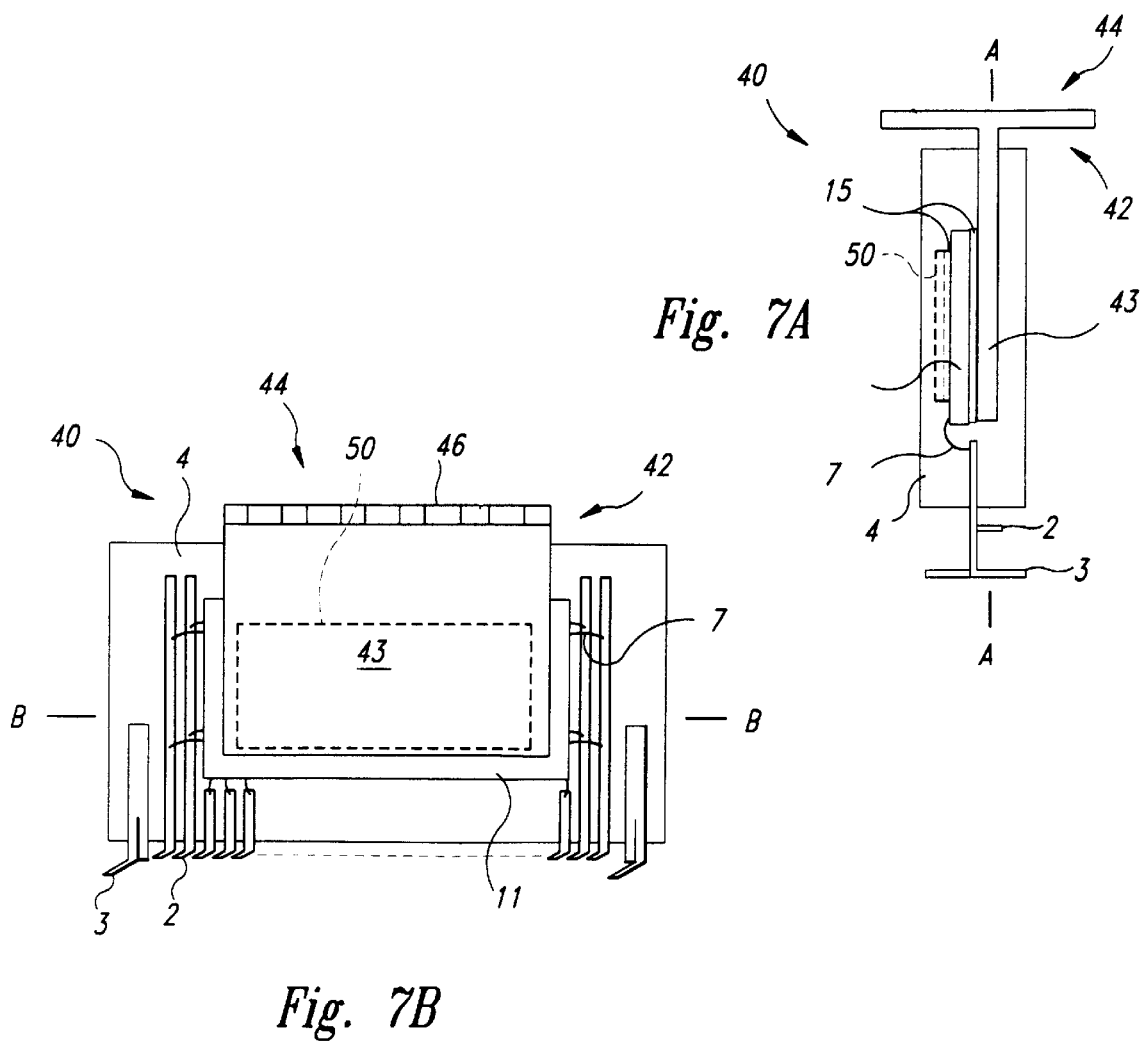
FIGS. 7A and 7B are cross-sectional views of the VSMP assembly of FIG. 6 along the axes A—A and B—B therein.

FIGS. 7A and 7B illustrate an embodiment in which an additional internal heat sink 50 of a thermally conductive material such as aluminum or copper mounts to the side of the chip 6, which is opposite an internal portion 43 of a heat sink 42. The heat sink 42 has external and internal portions 44, 43. Again, LOC tape 15 attaches the internal heat sink 50 to the semiconductor chip 6. The internal heat sink 50 further increases the overall capacity for heat dissipation. Heat transferred to the internal heat sink 50 would be dissipated by passing through the plastic housing 4.

Figure 6:
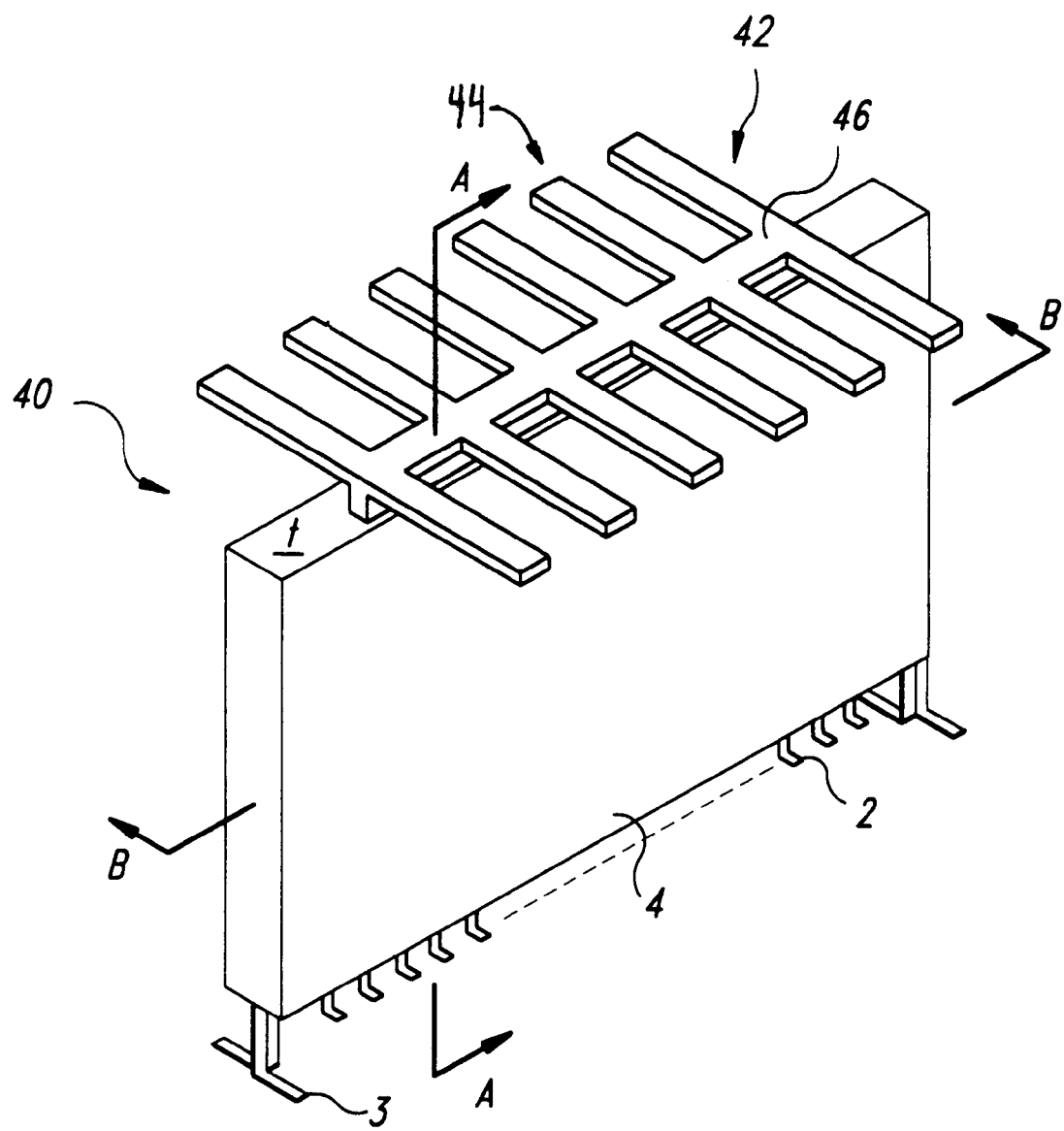
FIG. 6 is a 3-dimensional view of the VSMP assembly of FIG. 3 including an alternate embodiment to the exterior fin structures in FIGS. 3, 5A, and 5B.

The heat sink 12 of FIGS. 3, 4A, and 4B forms means for transferring heat. The heat sinks 26 of FIGS. 5A and 5B with alternate fin structures 22, 24 and 32, 34 form alternate means for transferring heat. Finally, the heat sink 42 of FIGS. 6, 7A, and 7B forms another means for transferring heat. Each means for transferring heat comprises portions of a heat sink internal and external to the plastic housing 4.

Figure 8:
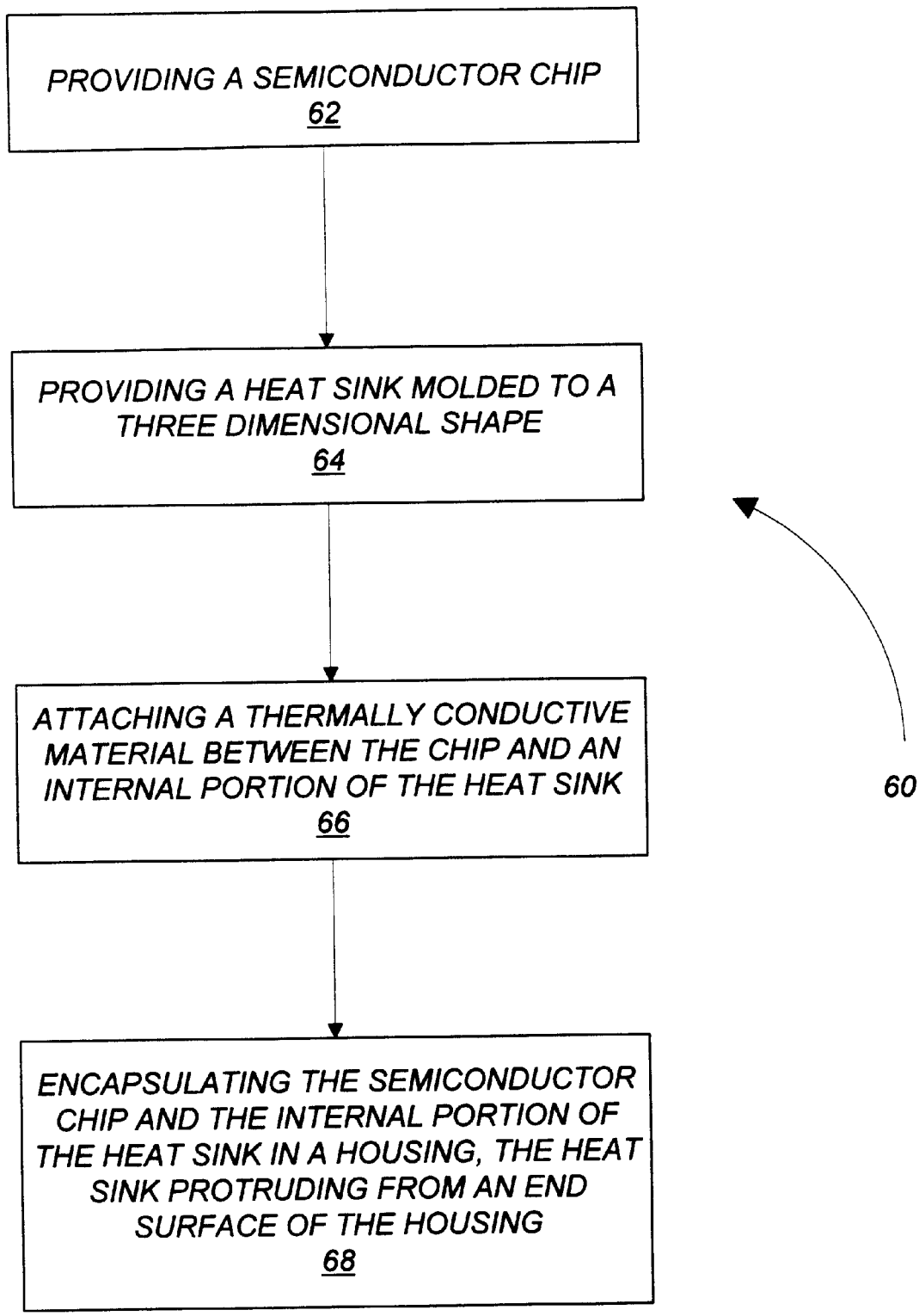
FIG. 8 is a flowchart illustrating an embodiment of a process for manufacturing the VSMP assemblies of FIGS. 3–7.

FIG. 8 is a flowchart illustrating a process 60 for manufacturing the VSMP assemblies 10, 20, 30, 40 of FIGS. 3, 4A, 4B, and 7. At block 62, a semiconductor chip is provided. At block 64, a heat sink structure is molded to a three dimensional shape accommodating the operational characteristics of the semiconductor chip 6. The molding step of block 64 may produce a final form for the heat sink 12, 42. The three dimensional shape may depend on the packing of employed for VSMP assemblies.

At block 66, a thermally conductive material is attached between one surface of the semiconductor chip 6 and an internal portion of the heat sink 12, 42. In one embodiment, the attachment process employs LOC tape 15 and entails several steps. First, the LOC tape 15, heat sink 12, 42, and chip 6 are positioned. Next, the LOC tape 15, heat sink 12, 42, and chip 6 are heated to a temperature sufficient to make the LOC tape 15 pliable. Next, external pressure is used to compress and seal the LOC tape 15 between the heat sink 12, 42 and semiconductor chip 6. LOC tape 15 has a thermal conductivity similar to that of SILOXANE®, produced by 3M®, of conductive epoxy or of silicon gel. After compressing the LOC tape 15, one surface of the semiconductor chip 6 is less than about 0.0001 inches from the internal portions 13, 43 of the heat sinks 12, 42 of FIGS. 4A or 7A, respectively.

After the semiconductor chip 6 and the heat sink 12, 42 are secured together, the semiconductor chip 12 is electrically connected to the lead terminals 2 by the metallic wires 7. Next, a jig (not shown) is used to hold the supporting terminals 3, the heat sink 12, 42 and the chip 6 in a mold.

At block 68, a liquid plastic resin is injected into the mold to form the plastic housing 4, which encapsulates, i.e. surrounds, the semiconductor chip 6 and the internal portion of the heat sink 12, 42, i.e. binding the heat sink 12, 42 strongly to the housing 4. A material such as epoxy, polyresin, or silicon polymer may be used to form the housing 4. The resulting plastic VSMP assembly 10, 20, 30, 40 may be thin, i.e. have a thickness of about 1.2 mm. Finally, the VSMP 10, 20, 30, 40 assembly is mounted to a circuit board (not shown). The heat sink 12, 42 protrudes from an end or narrower surface of the housing 4.

Illustrative embodiments of the invention are described above. In the interest of clarity, not all features of an actual implementation are described in this specification. It will of course be appreciated that in the development of any such actual embodiment, numerous implementation-specific decisions must be made to achieve the developer' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

What is claimed is:

1. A semiconductor device assembly, comprising:
   a semiconductor chip;
   a heat sink having internal and external portions, the internal portion being thermally coupled to one surface of the semiconductor chip; and
   a housing encapsulating the semiconductor chip and the internal portion;
   wherein said external portion of said heat sink projects out from opposite first and second end surfaces of said housing.

2. The assembly of claim 1, further comprising a thermally conductive material that mechanically couples said surface of the semiconductor chip and said internal portion.

3. The assembly of claim 1, wherein said exterior heat sink portion includes a fin-shaped structure having at least two adjacent posts extending away from an adjacent surface of said housing.

4. The assembly of claim 3, further including a third post directed opposite said two posts, said at least two posts being complementarily positioned to said third post to enable interlacing of adjacent assemblies.

5. The assembly of claim 1, wherein an extension of the external portion extends adjacent a front face of said housing.

6. The assembly of claim 3, wherein the extension connects the external portion protruding from opposite end surfaces of said housing.

7. The assembly of claim 1, wherein said heat sink is a molded structure.

8. The assembly of claim 1, wherein material of the housing passes through integrity holes in the internal portion of the heat sink.

9. The assembly of claim 8, wherein said metallic material comprises one of copper, aluminum, and gold.

10. The assembly of claim 1 further including a second heat sink thermally coupled to a second surface of said semiconductor chip.

11. The assembly of claim 1, wherein said semiconductor chip is SLDRAM.

12. The assembly of claim 1, wherein the housing comprises molded plastic.

13. The assembly of claim 1, wherein the heat sink is immovably fixed into the housing.

14. A vertical surface mount package (VSMP) assembly, comprising:
   a semiconductor chip;
   a heat sink for transferring heat;
   a thermally conductive material coupling said semiconductor chip to said first heat sink; and
   a housing encapsulating an internal portion of said first heat sink and said semiconductor chip;
   wherein said first heat sink further comprises an external portion projecting out from opposite first and second end surfaces of said housing.

15. The VSMP assembly of claim 14, wherein said first and second surfaces each has a smaller area than at least a third and an fourth surface of the housing.

16. The VSMP assembly of claim 15, wherein said heat sink includes a molded piece of metal.

17. The VSMP assembly of claim 14, further including a second internal heat sink thermally coupled to a side of the chip opposite to said thermally conductive plate.

18. A semiconductor device assembly in accordance with claim 1, further comprising:
   a plurality of lead terminals projecting out of a bottom surface of said housing.

19. A semiconductor device assembly in accordance with claim 18, wherein said bottom surface is substantially orthogonal to said opposite first and second end surfaces.

20. A VSMP assembly in accordance with claim 16, further comprising:
   a plurality of lead terminals projecting out of a bottom surface of said housing.

21. A VSMP assembly in accordance with claim 19, wherein said bottom surface is substantially orthogonal to said opposite first and second end surfaces.

* * * * *